United States Patent
Pan et al.

(10) Patent No.: US 10,051,757 B1
(45) Date of Patent: Aug. 14, 2018

(54) ELECTRONIC PACKAGE MODULE

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: Bothhand Enterprise Inc., Tainan (TW)

(*) Notice: Subject to any disclaimer, the term of this patent is extended or adjusted under 35 U.S.C. 154(b) by 0 days.

(21) Appl. No.: 15/782,285

(22) Filed: Oct. 12, 2017

(30) Foreign Application Priority Data

May 9, 2017 (TW) .............................. 106115243 A

(51) Int. Cl.
| | |
|---|---|
| *H05K 7/00* | (2006.01) |
| *H05K 7/02* | (2006.01) |
| *H05K 7/14* | (2006.01) |
| *H01L 49/02* | (2006.01) |
| *H01F 5/04* | (2006.01) |
| *H01L 23/498* | (2006.01) |
| *H01L 23/528* | (2006.01) |
| *H01F 5/00* | (2006.01) |
| *H01L 27/02* | (2006.01) |

(52) U.S. Cl.
CPC ............. *H05K 7/026* (2013.01); *H01F 5/003* (2013.01); *H01F 5/04* (2013.01); *H01L 23/49805* (2013.01); *H01L 23/528* (2013.01); *H01L 27/0207* (2013.01); *H01L 28/10* (2013.01); *H05K 7/14* (2013.01)

(58) Field of Classification Search
CPC ...... H05K 7/026; H05K 7/14; H01L 27/0207; H01L 28/10; H01L 23/528; H01L 23/49805; H01F 5/04; H01F 5/003
USPC ......................................................... 361/745
See application file for complete search history.

(56) References Cited

U.S. PATENT DOCUMENTS

| 6,912,781 | B2 * | 7/2005 | Morrison | H01F 27/292 29/592.1 |
|---|---|---|---|---|
| 8,203,853 | B2 * | 6/2012 | Chen | H01F 17/062 336/65 |
| 9,661,766 | B2 * | 5/2017 | Pan | H05K 5/0091 |
| 2009/0273908 | A1 * | 11/2009 | Tsao | H01F 27/022 361/748 |
| 2010/0142173 | A1 * | 6/2010 | Chen | H01F 17/062 361/811 |

* cited by examiner

*Primary Examiner* — Hung S Bui
(74) *Attorney, Agent, or Firm* — Michael Best & Friedrich LLP

(57) ABSTRACT

An electronic package module includes a packaging box, multiple terminals, and a coil unit. The packaging box includes a mounting wall including a base surface, multiple protruding blocks disposed on the mounting wall, and multiple gaps each being located between adjacent two of the protruding blocks. The terminals are mounted to the mounting wall, and each have a welding section received in a corresponding one of the gaps and having a welding surface and a guiding surface bent from the welding surface. The coil unit includes multiple wires each having a connecting section connected to the welding surface and an extending section bent from the connecting section and abutting against the guiding surface.

8 Claims, 6 Drawing Sheets

ELECTRONIC PACKAGE MODULE

CROSS-REFERENCE TO RELATED APPLICATION

This application claims priority of Taiwanese Patent Application No. 106115243, filed on May 9, 2017.

FIELD

The disclosure relates to an electronic package module, and more particularly to an electronic package module that includes at least one coil unit.

BACKGROUND

Referring to FIGS. 1 and 2, an electronic package module 1 disclosed in Taiwanese Utility Model No. M416890 U1 includes a packaging box 11, a plurality of terminals 12 that are mounted to the packaging box 11, and a plurality of coil units 13 that are receiving in the packaging box 11 and that are electrically connected to the terminals 12. The packaging box 11 includes a box body 111 that defines a receiving space 110, and that includes two mounting walls 112 respectively located at opposite sides of the receiving space 110. Each of the mounting walls 112 has an inner side surface 113 that faces the receiving space 110, an outer side surface 114 that is parallel to and spaced apart from the inner side surface 113, a horizontal base surface 115 that is perpendicularly connected to and extends outwardly from the inner side surface 113, and a plurality of protruding blocks 116 that are spaced apart from each other and that are located between the base surface 115 and the outer side surface 114.

The terminals 12 are arranged in two rows that are respectively mounted to the mounting walls 112. The terminals 12 in each row are spaced apart from each other. Each of the terminals 12 has an embedded section 121 that is embedded in a corresponding one of the mounting walls 112, a mounting section 122 that extends from the outer side surface 114 of the corresponding one of the mounting walls 112, and a welding section 123 that is connected between the embedded section 121 and the mounting section 122 and that is horizontally disposed on the base surface 115 of the corresponding one of the mounting walls 112. Each of the coil units 13 includes a plurality of wires 131 each being electrically connected to the welding section 123 of a corresponding one of the terminals 12.

During assembly, each of the wires 131 of each of the coil units 13 are moved into contact with the welding section 123 of the corresponding one of the terminals 12, followed by performing tin welding to achieve electrical connection and fixing.

However, before tin welding, each of the wires 131 in contact with the welding section 123 of the corresponding one of the terminals 12 may be undesirably displaced owing to lack of fixing mechanism, resulting in dissatisfied welding quality or even detachment of the wires 131 during transportation or after long-term use.

SUMMARY

Therefore, an object of the present disclosure is to provide an electronic package module that can alleviate the drawback associated with the prior art.

According to an aspect of the present disclosure, an electronic package module includes a packaging box, a plurality of terminals, and at least one coil unit.

The packaging box includes at least one mounting wall. The at least one mounting wall includes a base surface, a row of protruding blocks disposed on the base surface and spaced apart from each other, and a plurality of gaps each being located between adjacent two of the protruding blocks.

The terminals are mounted to the at least one mounting wall of the packaging box. Each of the terminals has a mounting section that extends from the packaging box, and a welding section that is received in a corresponding one of the gaps. The welding section of each of the terminals has a welding surface that is perpendicular to the base surface of the at least one mounting wall, and a guiding surface that is bent from the welding surface.

The at least one coil unit is mounted to the packaging box, and includes a plurality of wires. Each of the wires of the at least one coil unit has a connecting section that is electrically connected to the welding surface of the welding section of a corresponding one of the terminals, and an extending section that is electrically connected to and is bent from the connecting section of and that abuts against the guiding surface of the welding section of the corresponding one of said terminals.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
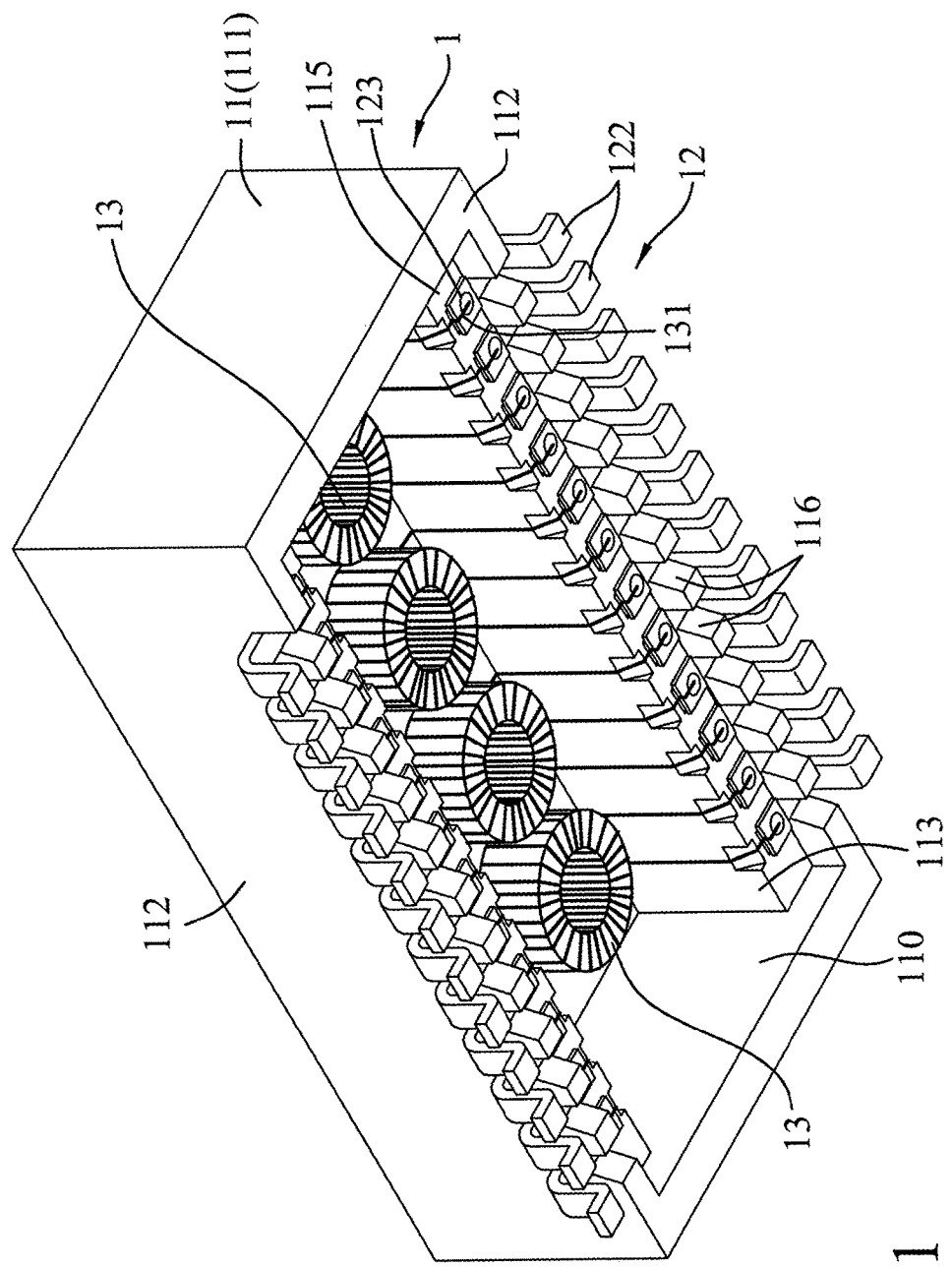
FIG. 1 is a perspective view of a conventional electronic package module disclosed in Taiwanese Utility Model No. M416890 U1.
Figure 2:
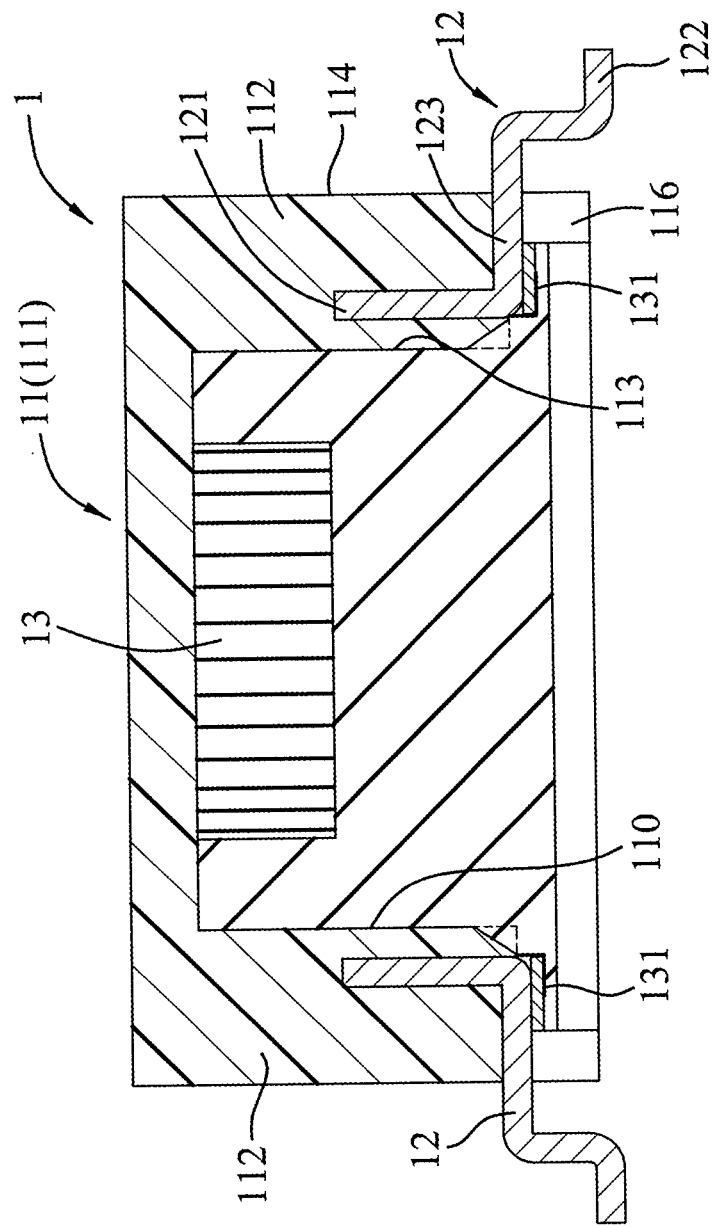
FIG. 2 is a sectional view of the conventional electronic package module.
Figure 3:
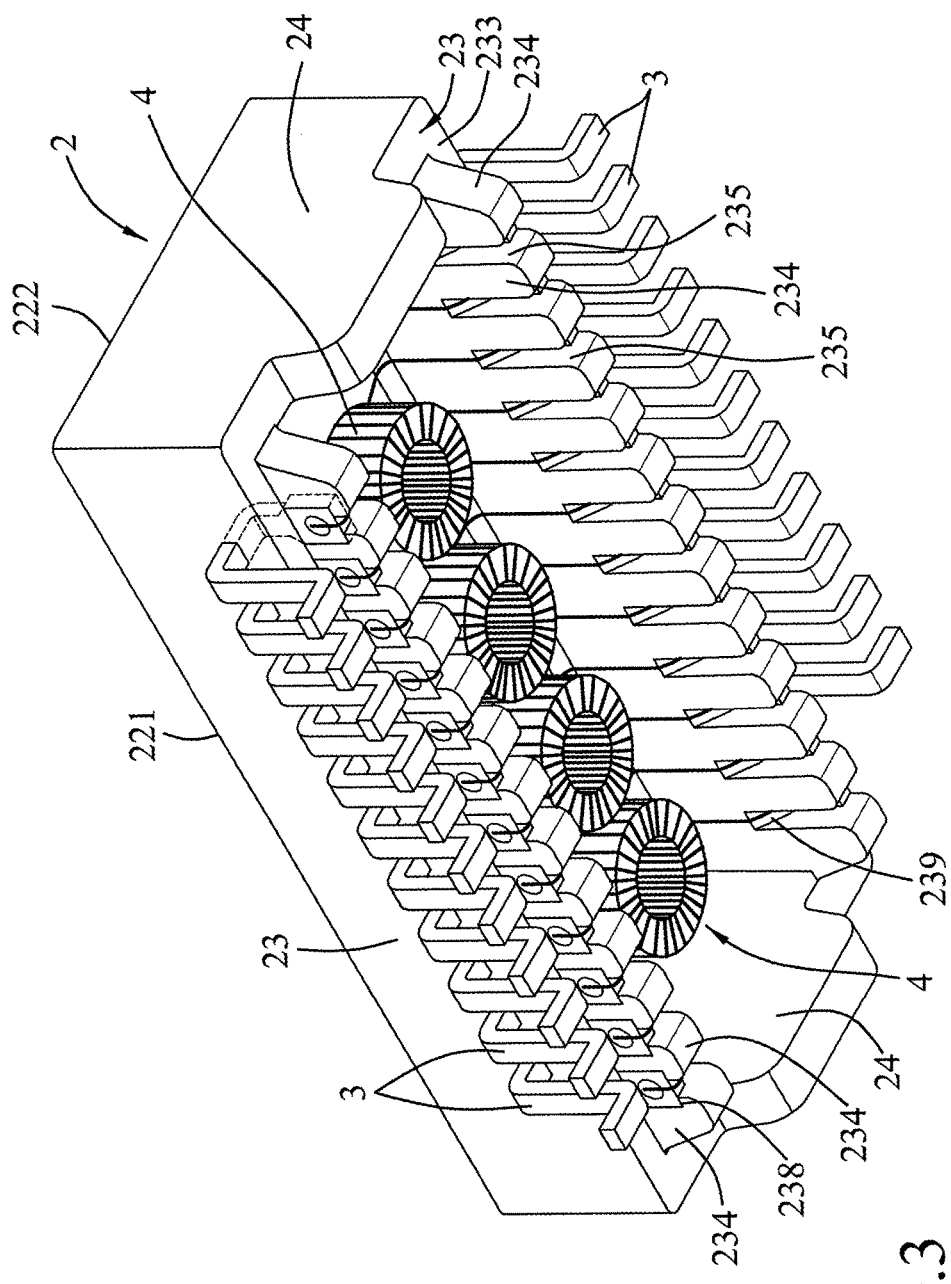
FIG. 3 is a perspective view of an embodiment of an electronic package module according to the present disclosure.
Figure 4:
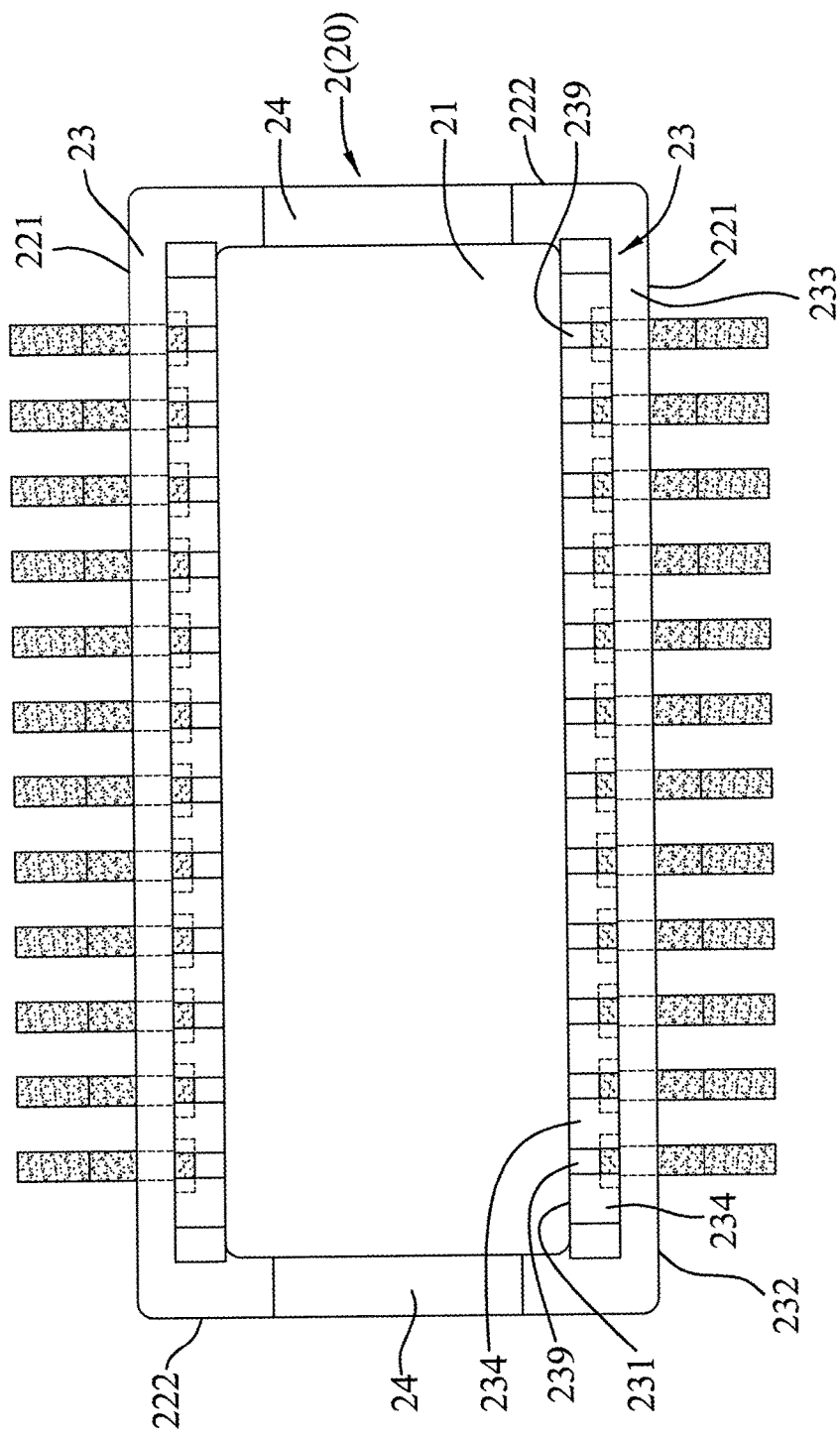
FIG. 4 is a schematic view of the embodiment, showing relative position between a packaging box and a plurality of terminals of the embodiment.

Referring to FIGS. 3 to 6, an embodiment of an electronic package module according to the present disclosure includes a packaging box 2, a plurality of terminals 3 that are mounted to the packaging box 2, and a plurality of coil units 4 that are mounted in the packaging box 2 and that are electrically connected to the terminals 3.

The packaging box 2 includes a box body 20, and a receiving space 21 that is defined by the box body 20 and that receives the coil units 4. The box body 20 includes a rectangular top wall 22 that has two long sides 221 and two short sides 222. The box body 20 further includes two mounting walls 23 that are respectively located at opposite sides of the receiving space 21 and that respectively and downwardly extend from the long sides 221 of the top wall 22, and two connecting walls 24 that respectively and downwardly extend from the short sides 222 of the top wall 22 and that are perpendicularly connected to the mounting walls 23. The mounting walls 23 and the connecting walls 24 surround the receiving space 21.

Each of the mounting walls 23 includes an inner side surface 231 facing the receiving space 21, an outer side surface 232 horizontally spaced apart from the inner side surface 231, a base surface 233 perpendicularly connected between the inner side surface 231 and the outer side surface 232, a row of protruding blocks 234 disposed on the base surface 233 and spaced apart from each other, and a plurality of gaps 235 each being located between adjacent two of the protruding blocks 234. Each of the protruding blocks 234 of each of the mounting walls 23 has an abutting surface 238 that faces a corresponding one of the gaps 235. The base surface 233 of each of the mounting walls 23 has a plurality of inclined surface 239 each being connected between the inner side surface 231 and a corresponding one of the gaps 235.

The terminals 3 of this embodiment are divided into two groups that are respectively mounted to the mounting walls 23 of the box body 20 and that are symmetric with respect to the receiving space 21. Each of the terminals 3 has a bent embedded section 31 that is embedded in a corresponding one of the mounting walls 23, a bent mounting section 32 that is electrically connected to the embedded section 31 and that extends outwardly from the outer side surface 232 of the corresponding one of the mounting walls 23, and a welding section 33 that is electrically connected to the embedded section 31, that is received in a corresponding one of the gaps 235 of the corresponding one of the mounting walls 23 and that extends outwardly from the base surface 233 of the corresponding one of the mounting walls 23. In this embodiment, the embedded section 31 of each of the terminals 3 is L-shaped (see FIG. 5), and has a first end 311 that is proximate to the base surface 233 of the corresponding one of the mounting walls 23 and that is electrically connected to the welding section 33, and a second end 312 that is proximate to the outer side surface 232 of the corresponding one of the mounting walls 23 and that is electrically connected to the mounting section 32. In this embodiment, the embedded section 31, the mounting section 32 and the welding section 33 of each of the terminals 3 are integrally formed (i.e., formed as one piece). It is worth mentioning that the shape of the mounting section 32 of each of the terminals 3 is not limited to that of this disclosure as long as the mounting section 32 of each of the terminals 3 can be fixedly mounted to a circuit board (not shown).

The welding section 33 of each of the terminals 3 has an inner surface 331 that faces the receiving space 21, a welding surface 332 that is parallel to and spaced apart from the inner surface 331 and that is perpendicular to the base surface 233 of the corresponding one of the mounting walls 23, and a guiding surface 333 that interconnects and is perpendicular to the inner surface 331 and the welding surface 332 and that abuts against the abutting surface 238 of a corresponding one of the protruding blocks 234 of the corresponding one of the mounting walls 23.

Each of the coil units 4 includes a plurality of wires 41, each of which has a connecting section 412 that is electrically connected to the welding surface 332 of the welding section 33 of a corresponding one of the terminals 3, and an extending section 411 that is electrically connected to and is bent from the connecting section 412 and that abuts against the guiding surface 333 of the welding section 33 of the corresponding one of the terminals 3. The structure of the coil units 4 is well known in the art, and is therefore not further described for the sake of brevity.

Figure 5:
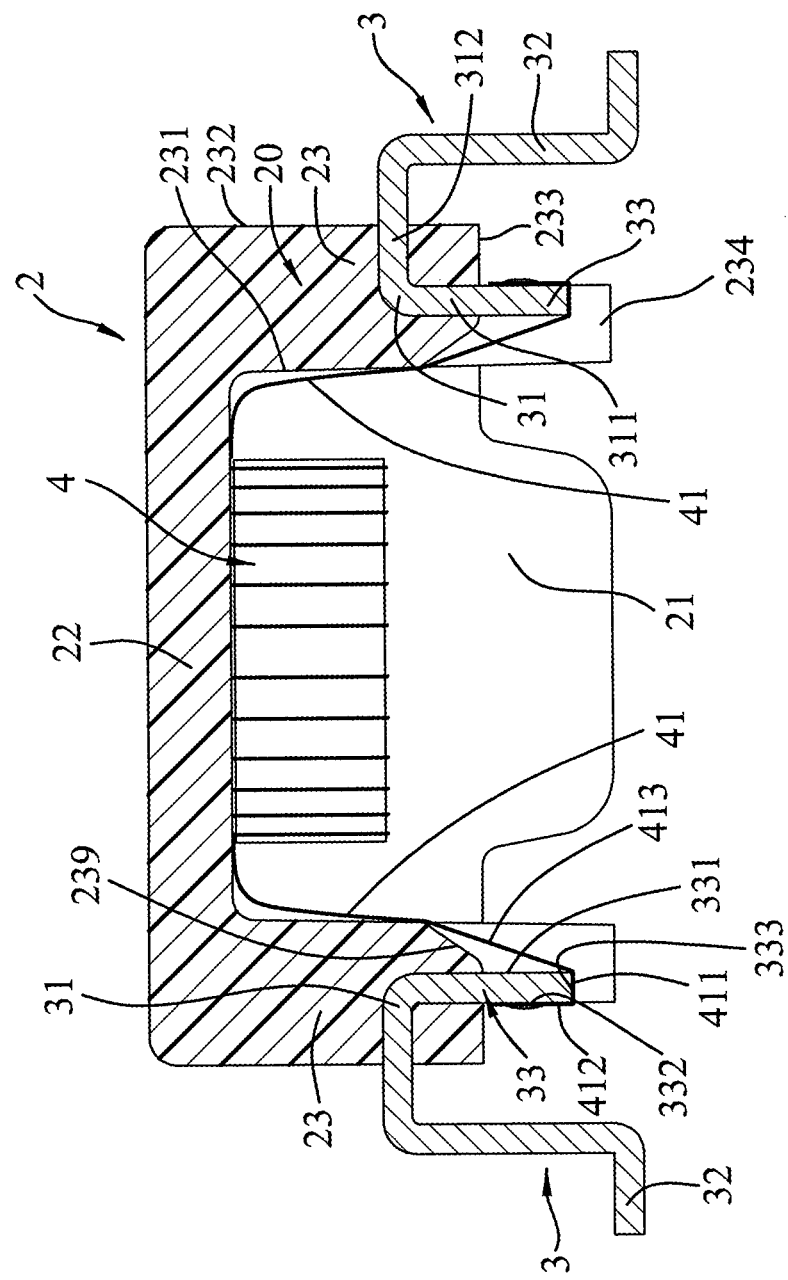
FIG. 5 is a sectional view of the embodiment.
Figure 6:
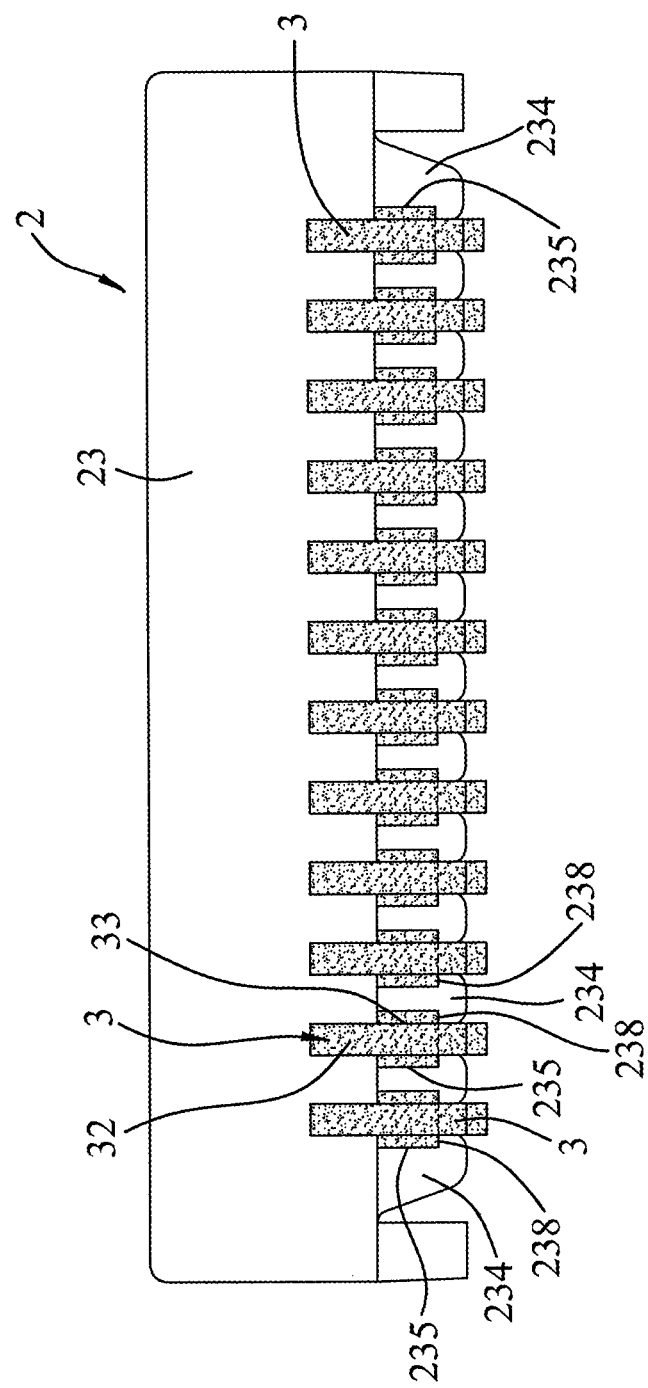
FIG. 6 is a schematic side view of the embodiment.

During manufacturing, the terminals 3 are first placed in a mold assembly (not shown), followed by injection molding a plastic material (not shown) to form the packaging box 2, such that the embedded section 32 of each of the terminals 3 is embedded in the corresponding one of the mounting walls 23 of the packaging box 2. It is worth mentioning that welding section 33 of each of the terminals 3 is disposed between adjacent two of the protruding blocks 234 of the corresponding one of the mounting walls 23, allowing the terminals 3 to be fixedly connected to the packaging box 2. Afterwards, the packaging box 2 is inverted so that the receiving space 21 is upwardly opened, and the coil units 4 are placed into the receiving space 21 of the packaging box 2, followed by extending each of the wires 41 of each of the coil units 4 toward the corresponding one of the terminals 3 in such a manner that, as shown in FIG. 5, a leading end portion of each of the wires 41 is moved into the corresponding gap 235 and around the welding section 33 of the corresponding terminal 3, so that the corresponding extending section 411 is horizontal and abuts against the guiding surface 333 of the corresponding terminal 3, the corresponding connecting portion 412 is vertical and abuts against the welding surface 332 of the corresponding terminal 3, and an inclined section 413 connected to the corresponding extending portion 411 and corresponding to the corresponding inclined surface 239 in position in a vertical direction. Finally, the connecting portions 412 are respectively welded onto the welding surfaces 332. It is worth mentioning that, during assembly, the entire electronic package module is placed upside-down for facilitating the mounting of the coil units 4 and the connection of the wires 41 with the terminals 3.

In summary, by using the terminals 3 of this disclosure, the wires 4 of the coil units 4 can be fixedly and firmly connected to the terminals 3 in the abovementioned manner (i.e., each connecting section 412 is electrically connected to the corresponding welding surface 332, and each extending section 411 is bent from the corresponding connecting section 412 and abuts against the corresponding guiding surface 333). Furthermore, assembly of the electronic package module of this disclosure is simplified and facilitated by the abovementioned structures, resulting in convenient assembly and improved quality.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:
1. An electronic package module comprising:
a packaging box including at least one mounting wall, said at least one mounting wall including a base surface, a row of protruding blocks disposed on said base surface and spaced apart from each other, and a plurality of gaps each being located between adjacent two of said protruding blocks;

a plurality of terminals mounted to said at least one mounting wall of said packaging box, each of said terminals having a mounting section that extends from said packaging box and a welding section that is received in a corresponding one of said gaps, said welding section of each of said terminals having a welding surface that is perpendicular to said base surface of said at least one mounting wall and a guiding surface that is bent from said welding surface; and at least one coil unit mounted to said packaging box and including a plurality of wires, each of said wires of said at least one coil unit having a connecting section that is electrically connected to said welding surface of said welding section of a corresponding one of said terminals, and an extending section that is electrically connected to and is bent from said connecting section and that abuts against said guiding surface of said welding section of the corresponding one of said terminals.

2. The electronic package module as claimed in claim 1, wherein each of said terminals further has an embedded section that interconnects said mounting section and said welding section, that is embedded in said at least one mounting wall, and that is bent.

3. The electronic package module as claimed in claim 2, wherein said welding section of each of said terminals further has an inner surface that is parallel to said welding surface, such that said guiding surface interconnects and is perpendicular to said inner surface and said welding surface.

4. The electronic package module as claimed in claim 1, wherein said packaging box further includes a box body, and a receiving space that is defined by said box body and that receives said at least one coil unit, said box body including two of said mounting walls that are respectively located at opposite sides of said receiving space, each of said mounting walls further including an inner side surface facing said receiving space, and an outer side surface spaced apart from said inner side surface, each of said terminals further having an embedded section that interconnects said mounting section and said welding section, that is embedded in a corresponding one of said mounting walls, and that is bent.

5. The electronic package module as claimed in claim 4, wherein said embedded section of each of said terminals has a first end that is proximate to said base surface of said corresponding one of said mounting walls and that is connected to said welding section, and a second end that is proximate to said outer side surface of said corresponding one of said mounting walls and that is connected to said mounting section.

6. The electronic package module as claimed in claim 4, wherein said welding section of each of said terminals further has an inner surface that faces said receiving space and that is parallel to said welding surface, such that said guiding surface interconnects and is perpendicular to said inner surface and said welding surface.

7. The electronic package module as claimed in claim 6, wherein said box body of said packaging box further includes a rectangular top wall that has two long sides and two short sides, said mounting walls respectively extending from said long sides of said top wall, said box body further including two connecting walls that respectively extend from said short sides of said top wall and that are perpendicularly connected to said mounting walls, said mounting walls and said connecting walls surrounding said receiving space.

8. The electronic package module as claimed in claim 1, wherein each of said protruding blocks has at least one abutting surface that faces a corresponding one of said gaps, said welding section of each of said terminals abutting against said at least one abutting surface of a corresponding one of said protruding blocks.

* * * * *